United States Patent
Yeh et al.

[19]

[11] Patent Number: 5,963,017
[45] Date of Patent: Oct. 5, 1999

[54] CALIBRATION OF THE BATTERY DEVICE FOR A PORTABLE COMPUTER SYSTEM

[75] Inventors: Kua-Chi Yeh; Li-Hui Chang, both of Taipei, Taiwan

[73] Assignee: Asustek Computer Inc., Taiwan

[21] Appl. No.: 09/097,088

[22] Filed: Jun. 12, 1998

[30] Foreign Application Priority Data

Apr. 1, 1998 [TW] Taiwan ................................. 87204812

[51] Int. Cl.⁶ .................................................. H02J 7/00
[52] U.S. Cl. ......................... 320/132; 320/131; 320/130; 320/114; 320/DIG. 21
[58] Field of Search .................................... 320/133, 134, 320/132, 131, 130, 128, DIG. 21, 114; 324/426, 427; 340/636; 307/66, 46, 48

[56] References Cited

U.S. PATENT DOCUMENTS

| | | | |
|---|---|---|---|
| 3,796,940 | 3/1974 | Mauch et al. | 320/131 |
| 4,734,635 | 3/1988 | Theobald | 320/131 |
| 5,196,779 | 3/1993 | Alexandres et al. | 320/131 |
| 5,541,489 | 7/1996 | Dunstan | 320/134 |
| 5,691,742 | 11/1997 | O'Conner et al. | 320/DIG. 21 |
| 5,698,961 | 12/1997 | Kutz et al. | 320/125 |
| 5,705,910 | 1/1998 | Kito et al. | 320/132 |
| 5,793,188 | 8/1998 | Cimbal et al. | 320/132 |
| 5,890,780 | 4/1999 | Tomiyori | 320/132 |

*Primary Examiner*—Peter S. Wong
*Assistant Examiner*—K. Shin
*Attorney, Agent, or Firm*—Fulbright & Jaworski L.L.P.

[57] ABSTRACT

A capacity calibration apparatus for the battery of a portable computer system is provided. The computer system includes a main board circuit, a processor unit, a display unit, a power-supply board circuit, a battery and a parallel port interface. The capacity calibration apparatus includes a standard parallel port interface and a control circuit. The standard parallel port interface is connected to the parallel port interface of the computer system. Via the parallel port interface, the computer system outputs at least one control signal to the capacity calibration apparatus. The capacity calibration apparatus selectively outputs the alternating current supply to the power-supply board circuit in order to proceed a charge/discharge procedure of a predetermined type such that the capacity value of the battery is initialized.

2 Claims, 3 Drawing Sheets

CALIBRATION OF THE BATTERY DEVICE FOR A PORTABLE COMPUTER SYSTEM

FIELD OF INVENTION

The invention relates to a capacity calibration apparatus for the battery of a portable computer system.

BACKGROUND OF INVENTION

There is provided a battery state detection chip, i.e. bq 2092, within the battery pack of a portable computer system. This chip records various states of the battery, including battery voltage, temperature, charge/discharge current, capacity, and version, etc. In general, the unit of the capacity of a battery is denoted as milli-ampere/hour, i.e. MAH. It is known that, before a new battery is used, it is required to perform an initialization operation to the values of the state within the chip. The detection chip provides accurate readings during life time of the battery only when this initialization operation is accurately done.

It is well known a DCR counter is provided in the detection chip of the battery. Each time the battery experiences a discharge operation from a full charge capacity condition, this DCR counter starts to count. In addition, the detection chip of the battery also includes a full-charge-capacity (FCC) register for storing the maximum capacity value of the battery which may be obtained from DCR counter.

The calibration apparatus of the present invention together with a charge/discharge procedure is aimed to accomplish the initialization operation mentioned above.

SUMMARY OF INVENTION

A capacity calibration apparatus for the battery of a portable computer system is provided.

The portable computer system includes a main board circuit, a processor unit, a display unit, a power-supply board circuit, a battery and a parallel port interface.

The capacity calibration apparatus includes a standard parallel port interface and a control circuit. The standard parallel port interface is connected to the parallel port interface of the computer system. Via the parallel port interface, the computer system outputs at least one control signal to the capacity calibration apparatus. The capacity calibration apparatus selectively outputs the alternating current supply to the power-supply board circuit in order to proceed a charge/discharge procedure of a predetermined type such that the capacity value of the battery is initialized.

In a preferred embodiment, the control circuit includes a logic circuit, a relay and a switch circuit.

The logic circuit is responsive to the control signal and outputs a switch signal. The relay has a first terminal and a second terminal. The first terminal inputs the alternating current supply. The switch circuit is responsive to the switch signal and controls turn-on or turn-off of the relay such that the second terminal of the relay selectively outputs the alternating current supply.

The details and merits of the invention may be best understood by the following recitations along with the appended drawings.

BRIEF DESCRIPTIONS OF THE DRAWINGS

DETAILED DESCRIPTION OF THE INVENTION

Figure 1:
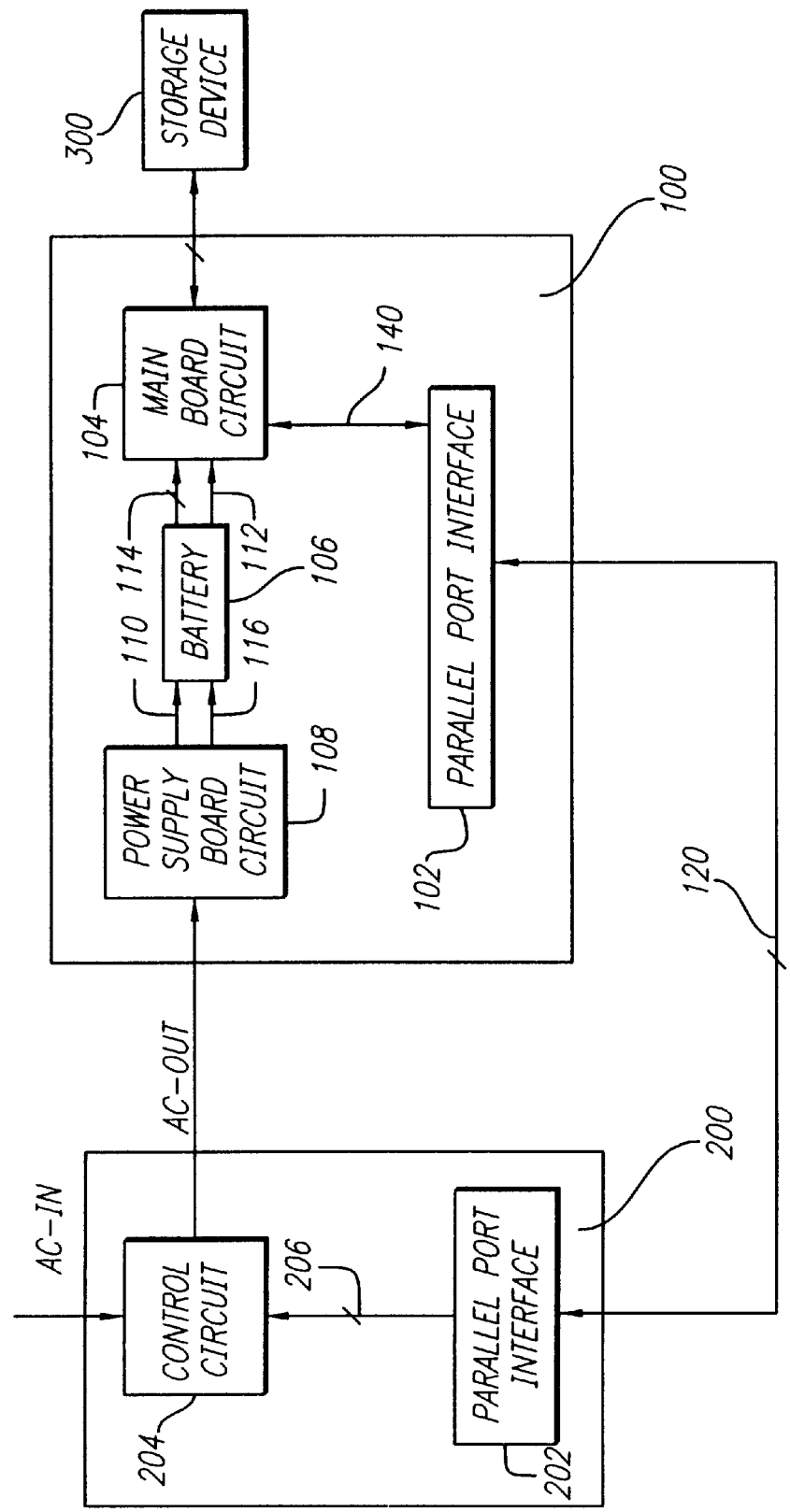
FIG. 1 illustrates the invention in functional blocks.

As shown in FIG. 1, a portable computer system 100 of conventional type includes a parallel port interface 102 (female connector), a main board circuit 104, a battery power supply 106 and a power-supply board circuit 108. In normal operation under which the power-supply board circuit 108 receives an alternating current supply AC-OUT, the alternating current supply is used to operate the main board circuit 104 and other elements in the system. Furthermore, the power-supply board circuit 108, during the normal operation, outputs a control signal 110 to perform a charge operation to the battery 106. The state values associated with the battery, i.e. the voltage value, temperature, etc., are sent to the main board circuit 104 via the signal lines 114. As an embodiment, the signal lines 114 are the System Management (SM) Bus of the system. In addition, the main board circuit 104 communicates with the parallel port interface 102 via a standard parallel port signal lines 140. Other than above, the portable computer system may include a storage device 300, i.e. a HDD or FDD, for storing an Utility which is to be executed in the system by a well known manner.

Further referring to FIG. 1, the invention provides a capacity calibration apparatus 200 connected to the parallel port interface 102 of the computer system 100. Along with a charge/discharge utility program pre-stored in the storage device 300, the invention performs a battery capacity calibration over the battery 106.

As shown, the calibration apparatus 200 includes a control circuit 204 and a standard parallel port interface 202 (male connector). During the calibration operation of the invention, the interface 102 on the side of the computer system 100 and the interface 202 on the side of calibration apparatus 200 communicates with each other via the signal lines 120. The capacity calibration apparatus 200 inputs an alternating current supply AC-IN and, under the control of the control signals 206 from the interface 202, selectively outputs the alternating current supply AC-OUT to the power-supply board circuit 108 of the computer system 100. Therefore, the power-supply board circuit 108 is turned on and off alternately to accomplish the charge/discharge operation to the battery 106.

Figure 2:
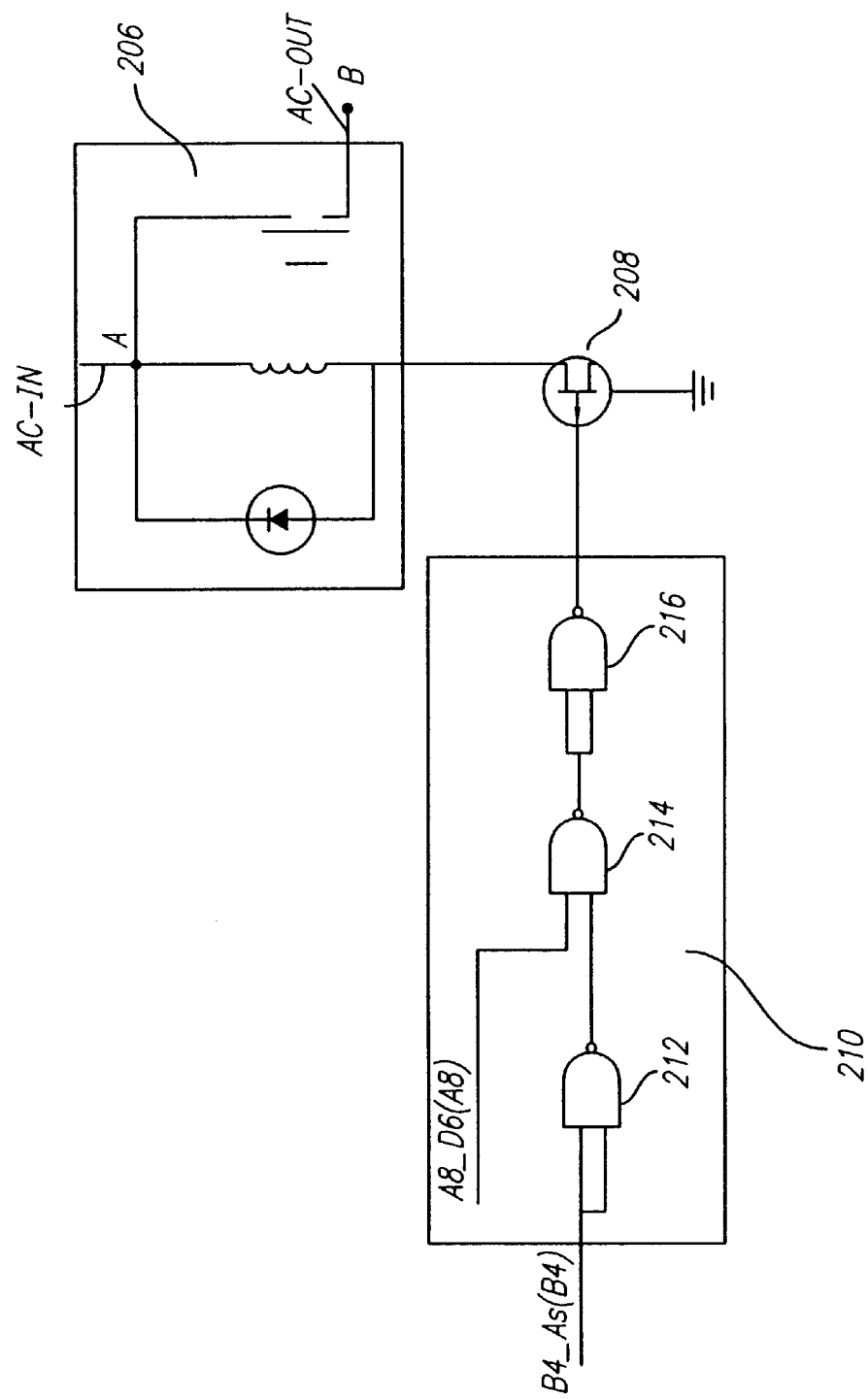
FIG. 2 illustrates one embodiment of the control circuit in FIG. 1.

As illustrated by an embodiment shown in FIG. 2, the control circuit 204 includes a relay 206, a switch device 208 and logic circuit 210. The switch device 208 controls the ON/OFF of the relay 206. The A terminal of the relay 206 inputs the alternating current supply AC-IN, and the B terminal outputs the alternating current supply AC-OUT. The logic circuit 210 includes NAND function gates 212, 214 and 216. The two inputs of the NAND gate 212 respectively input the BA_AS signal that comes from the B4 pin of the parallel port interface 202. One input signal of the NAND gate 214 is A8_D6 signal that comes from A8 pin of the parallel port interface 202. The other input signal to the gate 214 is the output signal from the NAND gate 212. The output signal of the NAND gate 214 is the input signal to the inputs of the NAND gate 216 respectively. As a result, as A8_D6 signal is logic HIGH and B4_AS signal is logic LOW, the switch device 208 conducts prohibiting the B terminal from outputting the AC-OUT supply. Under conditions of other values for A8_D6, B4_AS signals, the switch device 208 is turned off which allows the B terminal outputting the AC-OUT supply.

Figure 3:
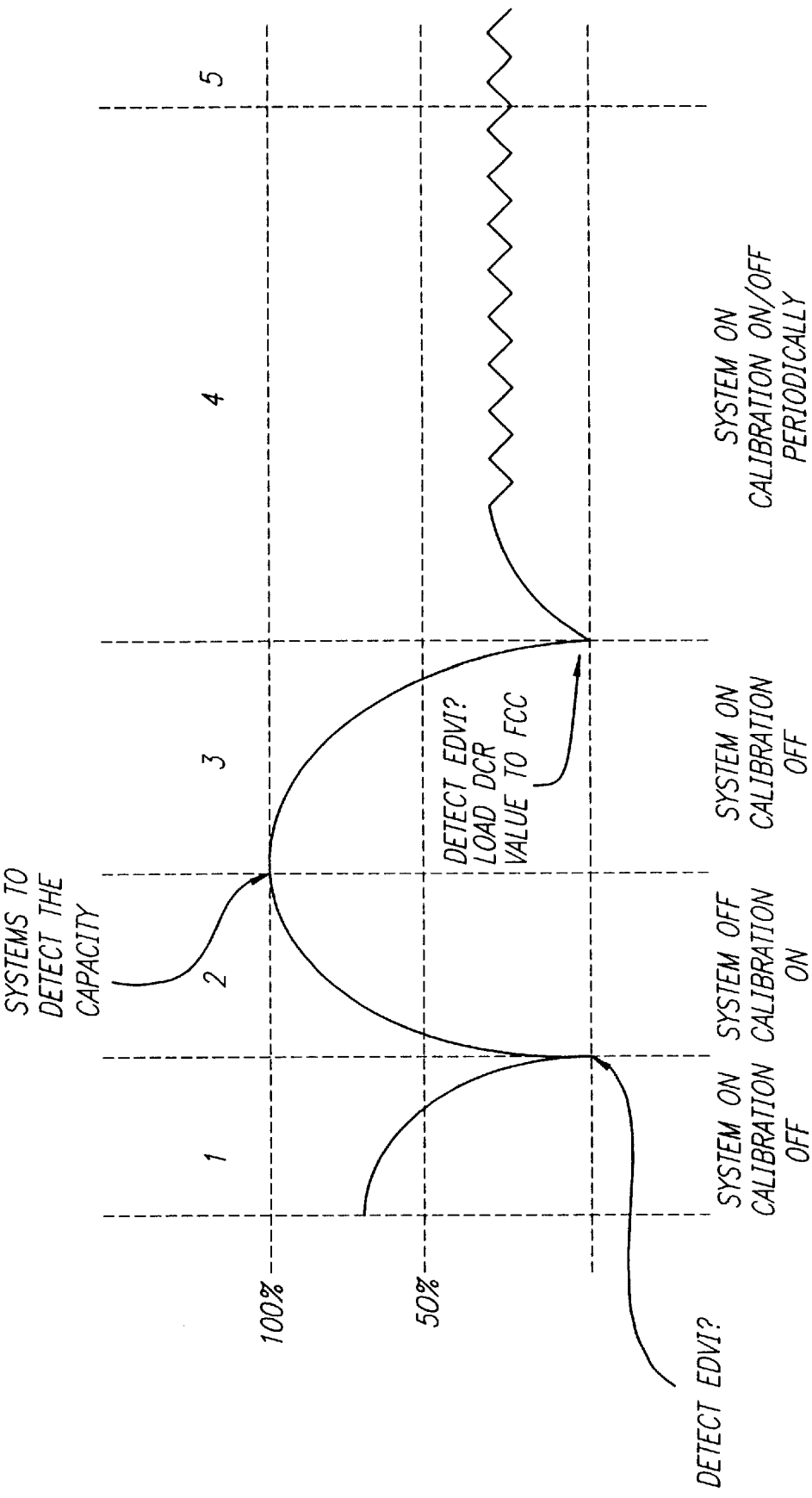
FIG. 3 illustrates a charge/discharge procedure performed by the invention to achieve the calibration of the battery capacity.

As a charge/discharge procedure of the invention stored in the storage device 300 is loaded into the memory on the main board circuit 104 for execution, the main board circuit 104, via the lines 140, the interface 102, the interface 202, controls the states of the A8_D6, B4_AS signals respectively. As a result, the alternating current supply AC-OUT is selectively output to accomplish the charge/discharge procedure as illustrated in FIG. 3. It is to be noted that, other charge/discharge procedures equivalent to that shown in FIG. 3 are likely to persons skilled in the arts to still accomplish the object of the invention with the provision of the calibration apparatus of the invention.

The preferred embodiment of the charge/discharge procedure of the invention may be understood by referring to a curve in FIG. 3 which indicates capacity-versus-time. In the figure, 100% represents the capacity of the battery reaches the nominal max. capacity while 50% indicates the battery capacity reaches one half of the nominal max. capacity. Also in the figure, five stages are disclosed. In the first stage, the invention performs a discharge action involving turn-ON of the computer system 100 and turn-OFF of the capacity calibration apparatus 200. In such condition, the battery 106 discharges and the capacity curve thereof experiences a parabolic decreasing phenomenon. During this discharge period, via the System Management bus 114, the main board circuit 104 may detect whether the battery capacity reaches a predetermined value, i.e. an EDVI value of around 13.8 volts. As this predetermined value is reached, the invention turns OFF the computer system 100 and turns ON the capacity calibration apparatus 200. This action allows the AC-OUT supply enter the power-supply board circuit 108 such that the power-supply board circuit 108 charges to the battery 106 in the second stage. During the second stage of the procedure, the invention periodically wakes up the computer system 100 to find out whether the battery capacity reaches one hundred percent via the System Management bus 114. Once the set condition is met, the invention immediately ends the second stage and commences the third stage. In the third stage, the invention then turns ON the computer system 100 and turns OFF the calibration apparatus 200 again to perform a discharge procedure from a full charge capacity condition. Accordingly, the capacity curve thereof experiences a parabolic decreasing phenomenon again.

It is recited above that there is a DCR counter in the detection chip of the battery 106. Each time the battery experiences discharge operation from a full charge capacity condition, the DCR counter starts to count. That is, as the battery 106 starts to discharge from the beginning of the third stage, the DCR counter starts to count. The detection chip of the battery 106 includes a full-charge-capacity (FCC) register for storing the maximum capacity value of the battery. When the main board circuit 104 detects the predetermined EDVI value is reached during the third stage, the invention immediately ends the third stage and enters the fourth stage. At the moment of transition from the third to fourth stage, the value within the DCR counter represents the full charge capacity. Accordingly, the detection chip of the battery 106 stores the value within the DCR counter into the FCC register at the end of the third stage such that the initialization with respect to the capacity value is accomplished.

The details of stages 4, 5 in FIG. 3 are not recited here since they are well known Run-In procedure irrelevant to the object of the present invention.

We claim:

1. A calibration apparatus for a battery device of a portable computer system, which includes a parallel port interface, a main board circuit, the battery and a power-supply board circuit, the calibration apparatus inputting an alternating current supply, comprising:

a standard parallel port interface coupled to the parallel port interface of the portable computer system for generating at least a control signal;

a control circuit, inputting the control signal, for selectively outputting the alternating current supply to the power-supply board circuit to perform charge/discharge operation of a predetermined type.

2. The calibration apparatus of claim 1, wherein the control circuit comprises:

a logic circuit, responsive to the control signal, for outputting a switch signal;

a relay having a first terminal and a second terminal, the first terminal inputting said alternating current supply;

means, responsive to the switch signal, for controlling turn-on or turn-off of the relay such that the second terminal of the relay selectively outputting the alternating current supply.

* * * * *